(12) United States Patent
Wang et al.

(10) Patent No.: US 9,513,735 B2
(45) Date of Patent: Dec. 6, 2016

(54) TOUCH DISPLAY DEVICE WITH FIRST AND SECOND ADHESIVE ASSEMBLIES

(71) Applicant: InnoLux Corporation, Miao-Li County (TW)

(72) Inventors: Jen-Hsiang Wang, Miao-Li County (TW); Ho-Chien Chang, Miao-Li County (TW); Sung-Sheng Fang, Miao-Li County (TW); Wei-Ru Kao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 33 days.

(21) Appl. No.: 14/604,057

(22) Filed: Jan. 23, 2015

(65) Prior Publication Data

US 2015/0234511 A1    Aug. 20, 2015

(30) Foreign Application Priority Data

Feb. 18, 2014 (TW) .............................. 103202804 U (51) Int. Cl.
*G06F 3/041* (2006.01)
*H01L 27/32* (2006.01)
(52) U.S. Cl.
CPC ........... *G06F 3/0412* (2013.01); *H01L 27/323* (2013.01); *G06F 2203/04103* (2013.01)

(58) Field of Classification Search
CPC .................... G06F 3/0412; G06F 2203/04103; H01L 27/323
See application file for complete search history.

(56) References Cited

U.S. PATENT DOCUMENTS

| | | | | |
|---|---|---|---|---|
| 2010/0164885 A1* | 7/2010 | Hosorogi | .............. | G06F 3/0412 345/173 |
| 2011/0227867 A1* | 9/2011 | Ogawa | .................... | G06F 3/044 345/174 |
| 2013/0329395 A1* | 12/2013 | Tsai | ........................ | F21V 15/01 362/19 |

* cited by examiner

*Primary Examiner* — Liliana Cerullo
(74) *Attorney, Agent, or Firm* — Muncy, Geissler, Olds & Lowe, P.C.

(57) ABSTRACT

A touch display device is disclosed. The touch display device includes a touch-display module, a supporting element, a first adhesive assembly and a second adhesive assembly. The touch-display module includes a touch panel and a display panel. The supporting element supports the touch panel and the display panel. The first adhesive assembly is disposed between the touch panel and the display panel, and includes a first adhesive element and a second adhesive element. The first adhesive element and the second adhesive element are located adjacent to each other and have a gap therebetween. The second adhesive assembly is disposed between the touch panel and the display panel and adhered to the supporting element. The second adhesive assembly includes a third adhesive element and a fourth adhesive element.

8 Claims, 7 Drawing Sheets

TOUCH DISPLAY DEVICE WITH FIRST AND SECOND ADHESIVE ASSEMBLIES

CROSS REFERENCE TO RELATED APPLICATIONS

This Non-provisional application claims priority under 35 U.S.C. §119(a) on Patent Application No(s). 103202804 filed in Taiwan, Republic of China on Feb. 18, 2014, the entire contents of which are hereby incorporated by reference.

BACKGROUND

Technical Field

The present invention relates to a touch display device.

Related Art

With the progress of technologies, various novel information devices are invented, such as cell phones, tablet computers, ultrabooks and GPS navigation apparatuses. Generally, a keyboard and mouse are commonly used to manipulate the information device for inputting information. Besides, the touch control technology currently also becomes a popular manipulation method for the information device and brings an intuitive operation. Accordingly, a touch display device using the touch control technology can provide a friendly and intuitive interface for the input operation, and therefore users of all ages can manipulate the touch display device by fingers or a stylus.

Regarding to an on-cell touch display device, a touch panel containing a sensing electrode layer is disposed on a display panel so as to form a touch display module. In the conventional art, a plurality of adhesive elements are provided at the periphery of the touch panel so as to fixing the touch panel to the display panel. Generally, the adhesive element includes modulated bezel tape or ABT tape. However, using the bezel tape or ABT tape to bond the touch panel and the display panel will form some gaps therebetween, which may cause the light leakage from the edge of the touch display device. In addition, the frame glue for bonding the touch panel and the display panel should be applied to a planar surface. If the bonding area is not a planar surface, which may be caused by the overlapping of tapes, the manufactured touch panel will be easily broken during the operation.

Therefore, it is an important subject to provide a novel touch display device, which can improve the edge light leakage and easily broken issues.

SUMMARY

An objective of the present invention is to provide a touch display device, which can improve the edge light leakage and easily broken issues.

To achieve the above objective, the present invention discloses a touch display device including a touch-display module, a supporting element, a first adhesive assembly and a second adhesive assembly. The touch-display module includes a touch panel and a display panel. The supporting element supports the touch panel and the display panel. The first adhesive assembly is disposed between the touch panel and the display panel, and includes a first adhesive element and a second adhesive element. The first adhesive element and the second adhesive element are located adjacent to each other and have a gap therebetween. The second adhesive assembly is disposed between the touch panel and the display panel and adhered to the supporting element. The second adhesive assembly includes a third adhesive element and a fourth adhesive element.

In one embodiment, the third adhesive element and the fourth adhesive element have an overlapped area corresponding to the gap.

In one embodiment, the gap has a first width along a first direction, the overlapped area has a second width along the first direction, and the first width is greater than or equal to the second width.

In one embodiment, the first adhesive element is disposed corresponding to the third adhesive element, and the second adhesive element is disposed corresponding to the fourth adhesive element.

In one embodiment, the first width is between 0.2 mm and 25 mm.

In one embodiment, first width is between 0.5 mm and 20 mm.

In one embodiment, the second width is between 0.1 mm and 20 mm.

In one embodiment, the first adhesive element, the second adhesive element, the third adhesive element and the fourth adhesive element have an L-shape, a strip shape or other shapes.

In one embodiment, the touch display device further includes a back plate for accommodating the touch-display module and the supporting element.

In one embodiment, the back plate has a protrusion away from the supporting element. The protrusion has a first surface and a second surface opposite to the first surface, and the fourth adhesive element extends from the supporting element to the first surface and the second surface.

In one embodiment, the first adhesive assembly further includes a fifth adhesive element, and the second adhesive assembly further comprises a seventh adhesive element. A gap between the second adhesive element and the fifth adhesive element has a third width along a second direction perpendicular to the first direction, and an overlapped area of the fourth adhesive element and the seventh element has a fourth width along the second direction. The third width is greater than or equal to the fourth width.

To achieve the above objective, the present invention also discloses a touch display device including a touch-display module, a supporting element, a first adhesive assembly and a second adhesive assembly. The touch-display module includes a touch panel and a display panel. The supporting element supports the touch panel. The first adhesive assembly is disposed at the periphery of the touch panel. The second adhesive assembly is located between the touch panel and the display panel, and disposed corresponding to the first adhesive assembly.

As mentioned above, in the touch display device of the invention, the first adhesive assembly is disposed between the touch panel and the display panel, and the second adhesive assembly is disposed between the touch panel and the display panel and is adhered to the supporting element. In addition, a gap is configured between the first and second adhesive elements of the first adhesive assembly, and the third and fourth adhesive elements of the second adhesive assembly have an overlapped area corresponding to the gap. Compared with the conventional art, since the third and fourth adhesive elements are overlapped, the edge light leakage issue can be eliminated. Moreover, the first adhesive assembly is not configured on the overlapped area of the second adhesive assembly, so that the bonding area of the first adhesive assembly is a planar surface, thereby preventing the broken issue of the touch panel during operation. As a result, the touch display device of the present invention can improve the edge light leakage and easily broken issues In another embodiment, the touch display device includes a touch-display module, a supporting element, a first adhesive assembly and a second adhesive assembly. The touch-display module includes a touch panel and a display panel. The supporting element supports the touch panel. The first adhesive assembly is disposed at the periphery of the touch panel. The second adhesive assembly is located between the touch panel and the display panel, and disposed corresponding to the first adhesive assembly. The configuration of the first adhesive assembly can block the light emitted from the backlight module so as to prevent the light from emitting through the gap between the supporting element and the display panel.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1A:
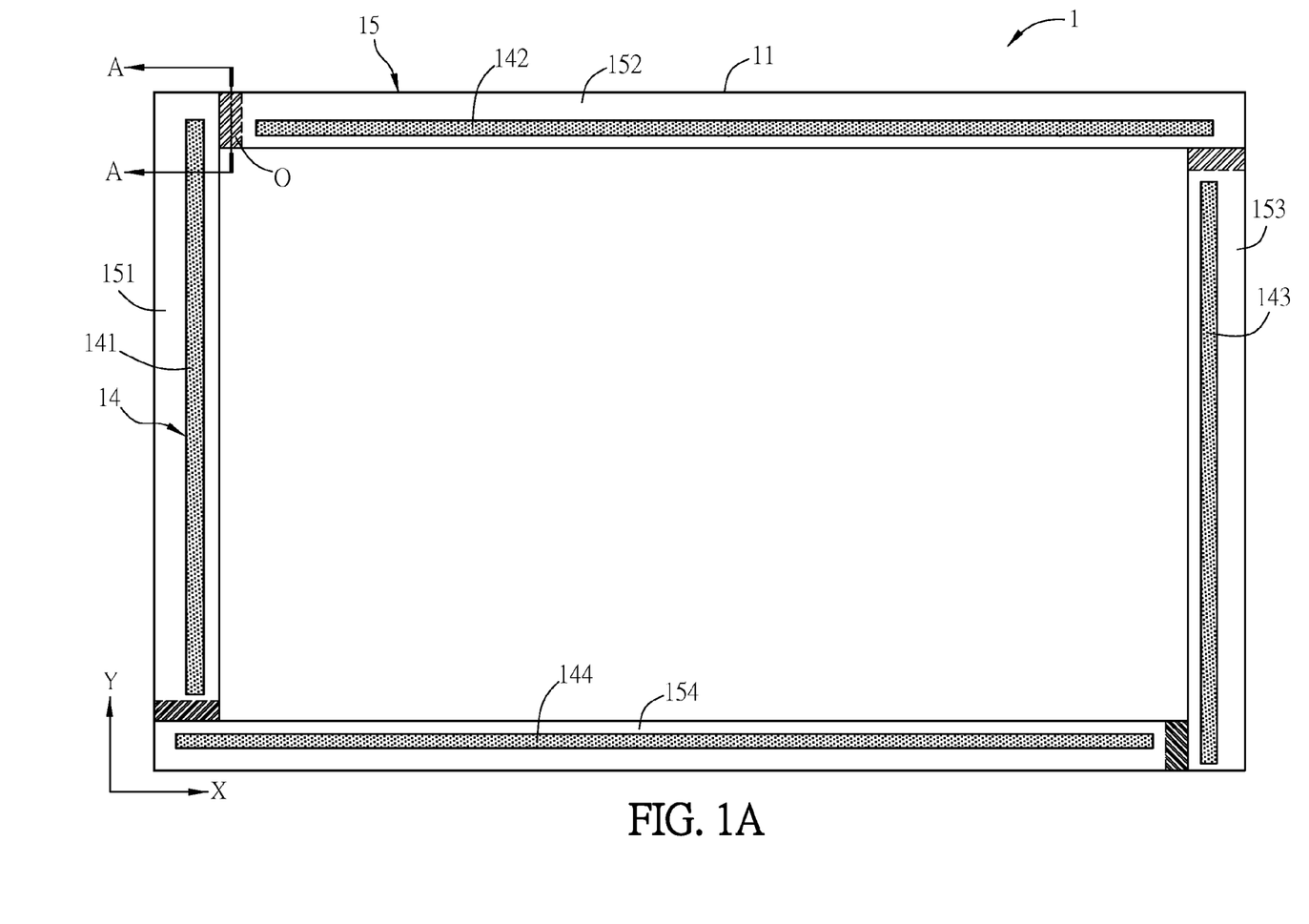
FIG. 1A is a top view of a touch display device according to a preferred embodiment of the invention.
Figure 1B:
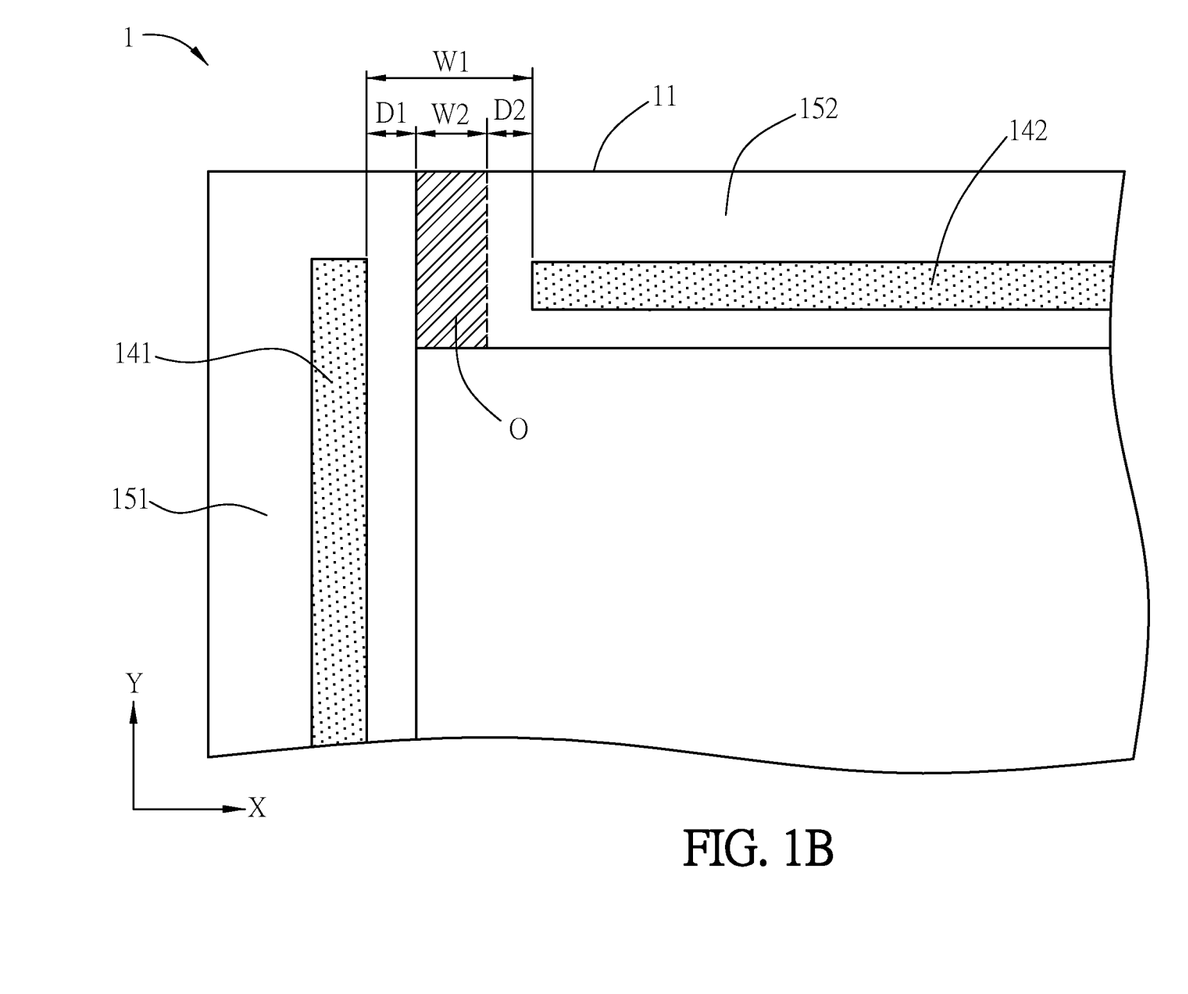
FIG. 1B is a partial enlarged diagram of FIG. 1A.
Figure 1C:
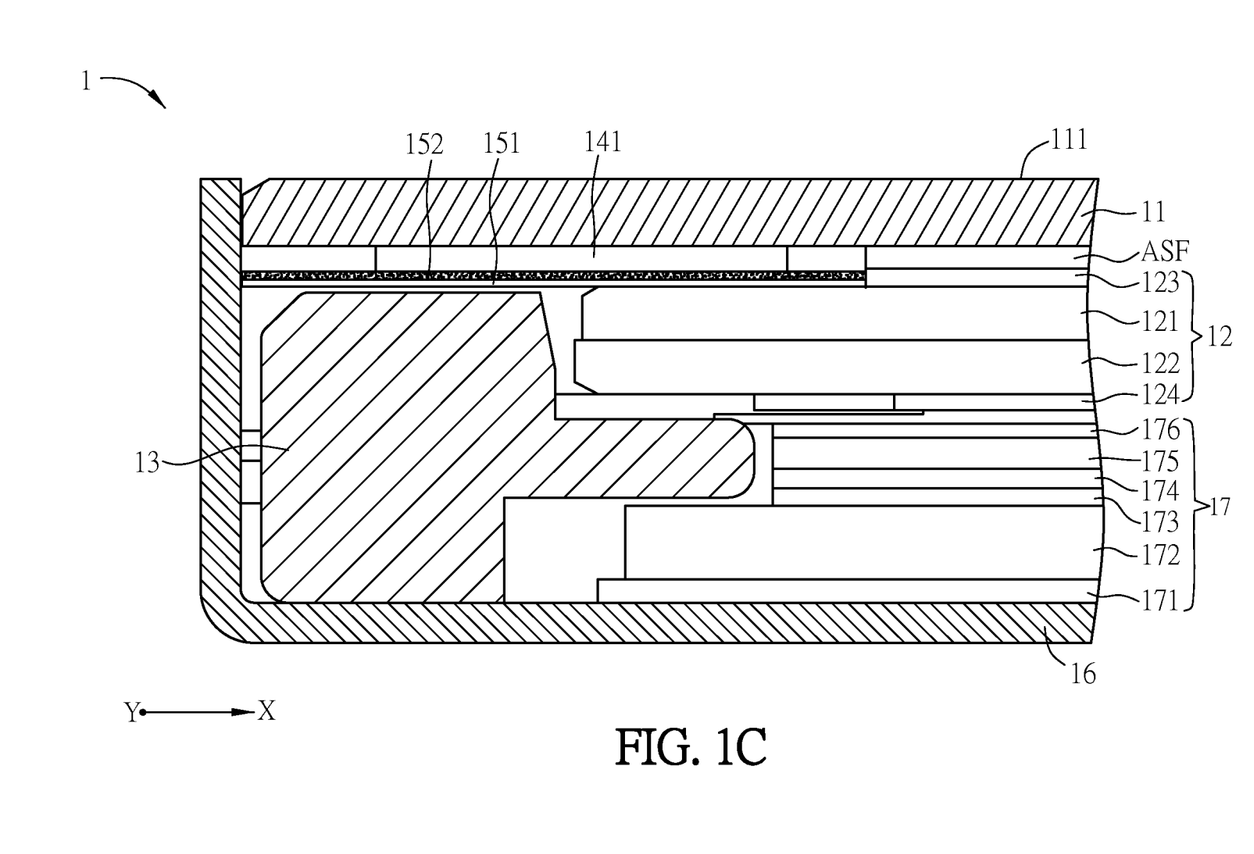
FIG. 1C is a sectional view of FIG. 1A along the line A-A.

FIG. 1A is a top view of a touch display device 1 according to a preferred embodiment of the invention, FIG. 1B is a partial enlarged diagram of FIG. 1A, and FIG. 1C is a sectional view of FIG. 1A along the line A-A. To be noted, FIG. 1A only shows a touch panel 11, a first adhesive assembly 14 and a second adhesive assembly 15, as well as their relationship, and the other components of the touch display device 1 are not shown. Herein, the touch display device 1 is, for example but not limited to, a liquid crystal touch display device or an OLED touch display device (with touch control function) or any other touch display device with touch control function.

Referring to FIGS. 1A to 1C, the touch display device 1 includes a touch-display module (including a touch panel 11 and a display panel 12), a supporting element 13, a first adhesive assembly 14 and a second adhesive assembly 15.

As shown in FIGS. 1A to 1C, the touch panel 11 is disposed corresponding to the display panel 12. In this embodiment, the touch panel 11 has a touch surface 111. Herein, a horizontal extension direction of the touch surface 111 is defined as a first direction X, and a second direction Y is on the plane of the touch surface 111 and perpendicular to the first direction X.

In addition, the display panel 12 can be an LCD panel or an OLED display panel, or any other flat display panel. In this embodiment, the display panel 12 is an LCD panel for example. The LCD panel (the display panel 12) includes a first substrate 121, a second substrate 122 and at least one optical film. The first substrate 121 is disposed opposite to the second substrate 122. The first substrate 121 and the second substrate 122 of the display panel 12 and the touch panel 11 can be a glass substrate or a plastic substrate, so that the touch display device 1 can be made thinner. In addition, the first substrate 121 is a color filter substrate, while the second substrate 122 is a thin-film-transistor (TFT) substrate. Of course, in other embodiments, the black matrix and filter layer can also be disposed on the TFT substrate, so that the second substrate 122 becomes a BOA (BM on array) substrate or a COA (color filter on array) substrate. This invention is not limited thereto. Besides, the display panel 12 may further include a liquid crystal layer (not shown), which is disposed between the first substrate 121 and the second substrate 122.

In this embodiment, the display panel 12 includes two optical films 123 and 124. The optical film 123 is an upper polarizer, and the optical film 124 is a lower polarizer. The optical film 123 (the upper polarizer) is disposed between the first substrate 121 and the touch panel 11, and the optical film 124 (the lower polarizer) is disposed at one side of the second substrate 122 away from the first substrate 121. In this case, the optical film 123 is located at the upper surface of the first substrate 121, and the optical film 124 is located at the lower surface of the second substrate 122. In other embodiments, if the display panel 12 is an OLED display panel, the display panel 12 may include only one optical film such as, for example but not limited to, a quarter-wave-plate circular polarizer, polarizer or anti-reflective film, or their combinations. Besides, the optical film is disposed between the first substrate 121 and the touch panel 11. In addition, the touch display device 1 may further include a functional film ASF, which is disposed between the touch panel 11 and the optical film 123. Herein, the functional film ASF can be an anti-scattering film for providing a protection function. The material of the anti-scattering film may include, for example but not limited to PET (polyethylene terephthalate), TAC (triacetyl cellulose), PMMA (poly-methylmethacrylate) or their combinations. Since the functional film ASF is configured between the touch panel 11 and the display panel 12, it can protect the user or other components of the touch display device 1 from the ejected broken glass pieces.

The supporting element 13 supports the touch panel 11 and the display panel 12. In this embodiment, the supporting element 13 is, for example, a frame for supporting the touch panel 11 and the display panel 12, and the touch panel 11 and the display panel 12 are disposed corresponding to each other.

The first adhesive assembly 14 is disposed between the touch panel 11 and the display panel 12 for bonding the touch panel 11 and the display panel 12. As shown in FIG. 1A, the first adhesive assembly 14 includes a first adhesive element 141 and a second adhesive element 142 disposed adjacent to the first adhesive element 141. In addition, the second adhesive assembly 15 is disposed between the touch panel 11 and the display panel 12, and is adhered to the supporting element 13. The second adhesive 15 includes a third adhesive element 151 and a fourth adhesive element 152.

In this embodiment, each of the first adhesive assembly 14 and the second adhesive assembly 15 includes four adhesive elements. Herein, the first adhesive assembly 14 further includes a fifth adhesive element 143 and a sixth adhesive element 144. The fifth adhesive element 143 is disposed adjacent to the second adhesive element 142, and the sixth adhesive element 144 is disposed adjacent to the fifth adhesive element 143 and the first adhesive element 141. Herein, the first adhesive element 141, the second adhesive element 142, the fifth adhesive element 143 and the sixth adhesive element 144 can be a gum strip (e.g. a frame glue), and they can be disposed at the periphery of the touch panel 11 and the display panel 12 in sequence for adhering the touch panel 11 to the display panel 12.

In addition, the second adhesive assembly 15 may further include a seventh adhesive element 153 and an eighth adhesive element 154. Herein, the third adhesive element 151, the fourth adhesive element 152, the seventh adhesive element 153 and the eighth adhesive element 154 are disposed at the periphery of the supporting element 13 and the display panel 12 in sequence. The third adhesive element 151, the fourth adhesive element 152, the seventh adhesive element 153 and the eighth adhesive element 154 are, for example, a bezel tape.

In this embodiment, the adhesive elements 141-144 have a strip shape, and the adhesive elements 151-154 have an L shape. However, in other embodiments, the adhesive elements 151-154 may have a long strip shape. The first adhesive element 141 is disposed corresponding to the third adhesive element 151, the second adhesive element 142 is disposed corresponding to the fourth adhesive element 152, the fifth adhesive element 143 is disposed corresponding to the seventh adhesive element 153, and the sixth adhesive element 144 is disposed corresponding to the eighth adhesive element 154. The adhesive elements 141-144 are correspondingly located over the adhesive elements 151-154.

The following description will discuss the case including the first adhesive element 141, the second adhesive element 142, the third adhesive element 151 and the fourth adhesive element 152 as well as their relationship.

As shown in FIG. 1B, the first adhesive element 141 and the second adhesive element 142 have a gap therebetween, and the gap has a first width W1 along the first direction X. The third adhesive element 151 and the fourth adhesive element 152 are partially overlapped along the first direction X and thus have an overlapped area O. The overlapped area O has a second width W2 along the first direction X. The overlapped area O is located corresponding to the gap between the first adhesive element 141 and the second adhesive element 142. The first width W1 is greater than or equal to the second width W2 (W1≥W2). In this embodiment, the first width W1 is greater than the second width W2.

The first width W1 is between 0.2 mm and 25 mm (0.2 mm≤W1≤25 mm). Preferably, the first width W1 is between 0.5 mm and 20 mm (0.5 mm≤W1≤20 mm). The second width W2 is between 0.1 mm and 20 mm (0.1 mm≤W2≤20 mm). In this embodiment, for example, the first width W1 is 2.2 mm and the second width W2 is 1 mm (W1≥W2). Along the X direction, one side of the first adhesive 141 and one side of the third adhesive 151 have a minimum distance D1, which is between 0.1 mm and 5 mm (e.g. 0.6 mm). In addition, along the X direction, one side of the second adhesive 142 and the overlapped area O have a minimum distance D2 (e.g. 0.6 mm).

The relationship of the adhesive elements 142, 143 and the adhesive element 152, 153, the relationship of the adhesive elements 143, 144 and the adhesive element 153, 154, and the relationship of the adhesive elements 144, 141 and the adhesive element 154, 151 can be referred to the above description of the adhesive elements 141, 142 and the adhesive element 151, 152, so the detailed descriptions thereof will be omitted.

As shown in FIG. 1C, the touch display device 1 may further include a back plate 16 and a backlight module 17. The back plate 16 is configured to accommodate the touch panel 11, the display panel 12, the supporting element 13 and the backlight module 17. The backlight module 17 is disposed corresponding to the display panel 12 for emitting light into the display panel 12, so that the display panel 12 can display the image normally. The backlight module 17 includes a reflective plate 171, a light guide plate 172 and a plurality of optical films 173, 174, 175 and 176. The optical films 173, 174, 175 and 176 can be, for example but not limited to, a prism sheet or a diffuser, or any other type of optical film, and this invention is not limited. The backlight module 17 is not the major point of the invention, and those skilled persons can understand the configuration and function thereof, so the detailed description thereof will be omitted. To be noted, when the display panel 12 is an OLED display panel, which is a self-illuminated panel, the above backlight module 17 is not needed.

Figure 2A:
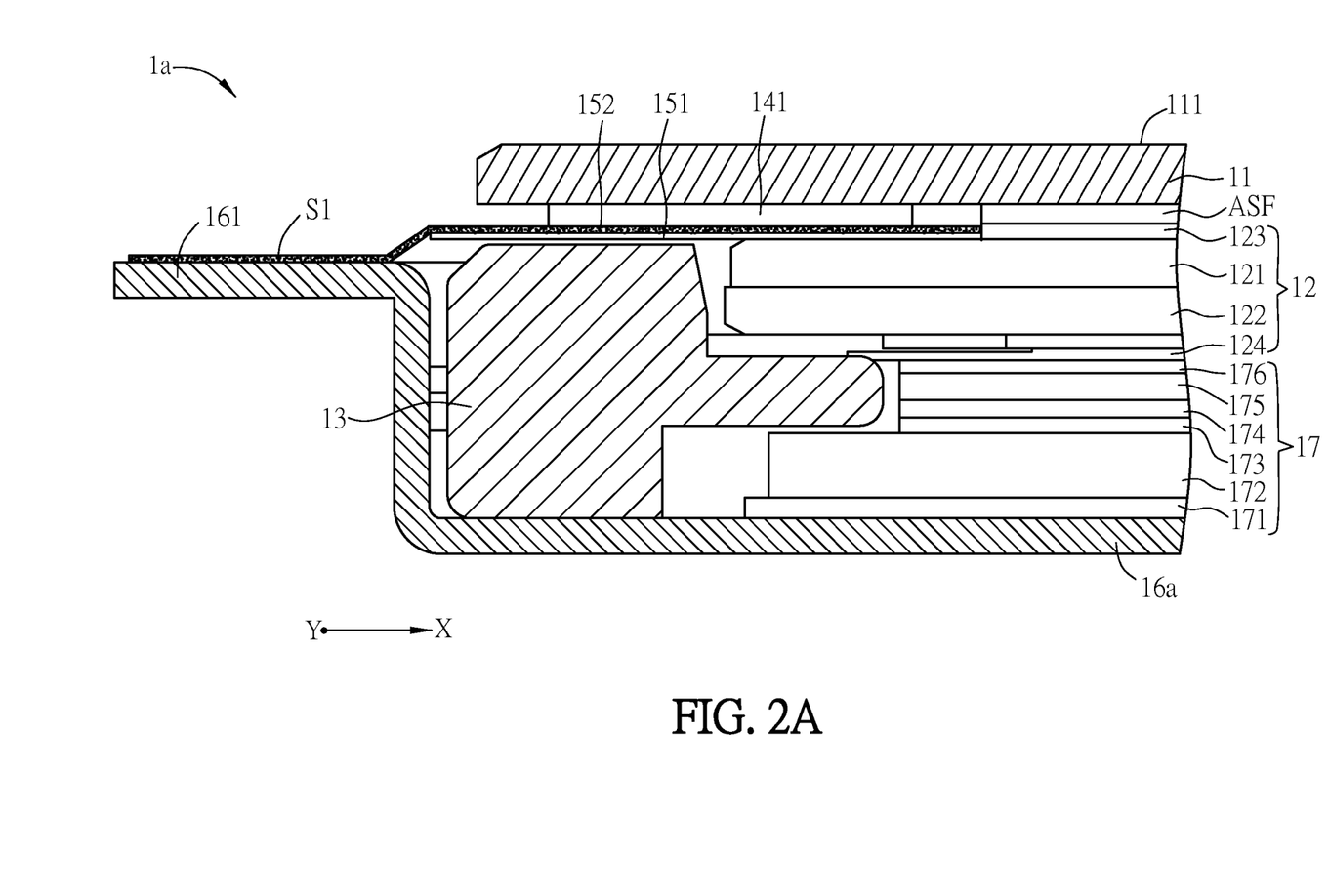
FIGS. 2A and 2B are schematic diagrams showing different touch display devices according to another embodiment of the invention.
Figure 2B:
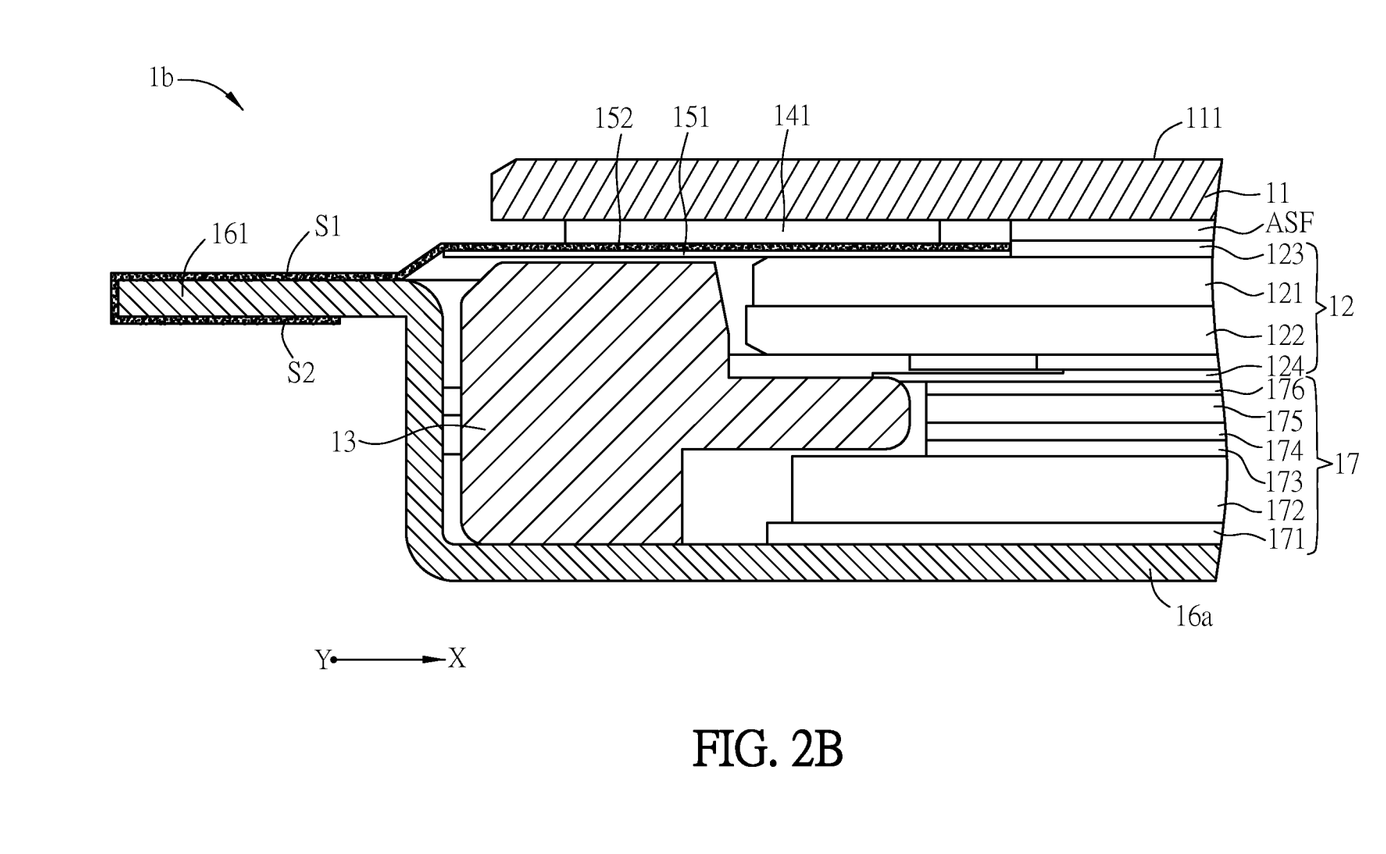

FIGS. 2A and 2B are schematic diagrams showing touch display device 1a and 1b according to another embodiment of the invention.

Different from the touch display device 1 of FIG. 1C, the back plate 16a of the touch display device 1a of FIG. 2A has a protrusion 161 away from the supporting element 13. The protrusion 161 has a first surface S1, and the fourth adhesive element 152 extends from the supporting element 13 and is adhered to the first surface S1. Herein, the protrusion 161 can be used to support other structural components of the system such as the outer frame or case (not shown).

Different from the touch display device 1a of FIG. 2A, the protrusion 161 of the back plate 16a in the touch display device 1b of FIG. 2B further has a second surface S2, which is disposed corresponding to the first surface S1. The fourth adhesive element 152 extends from the supporting element 13 and is adhered to the first surface S1 and the second surface S2.

The technical features of other components of the touch display devices 1a and 1b can be referred to the same components of the touch display device 1, so the detailed description thereof will be omitted.

Figure 3A:
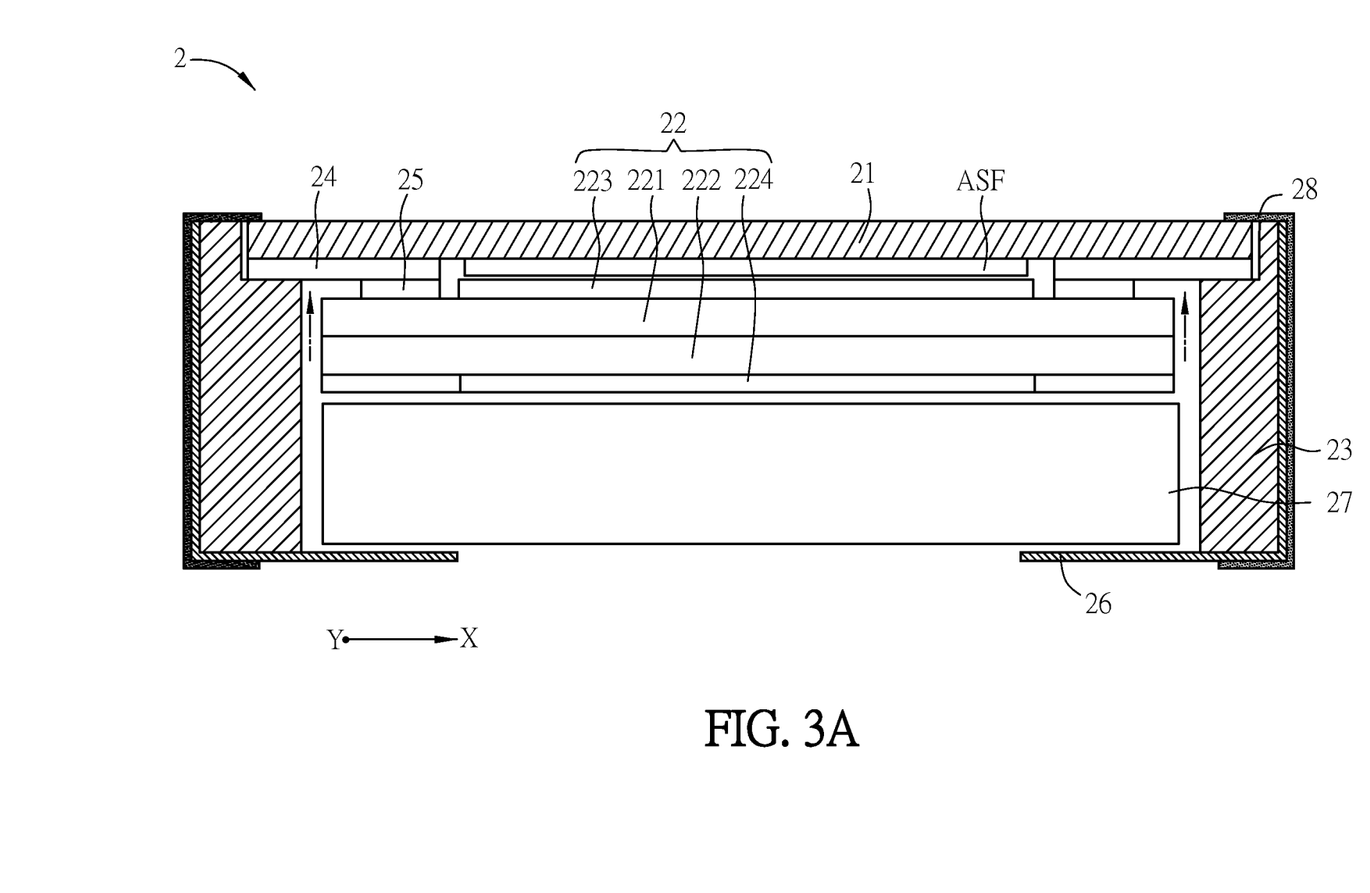
FIG. 3A is a schematic diagram showing a touch display device according to another embodiment of the invention.
Figure 3B:
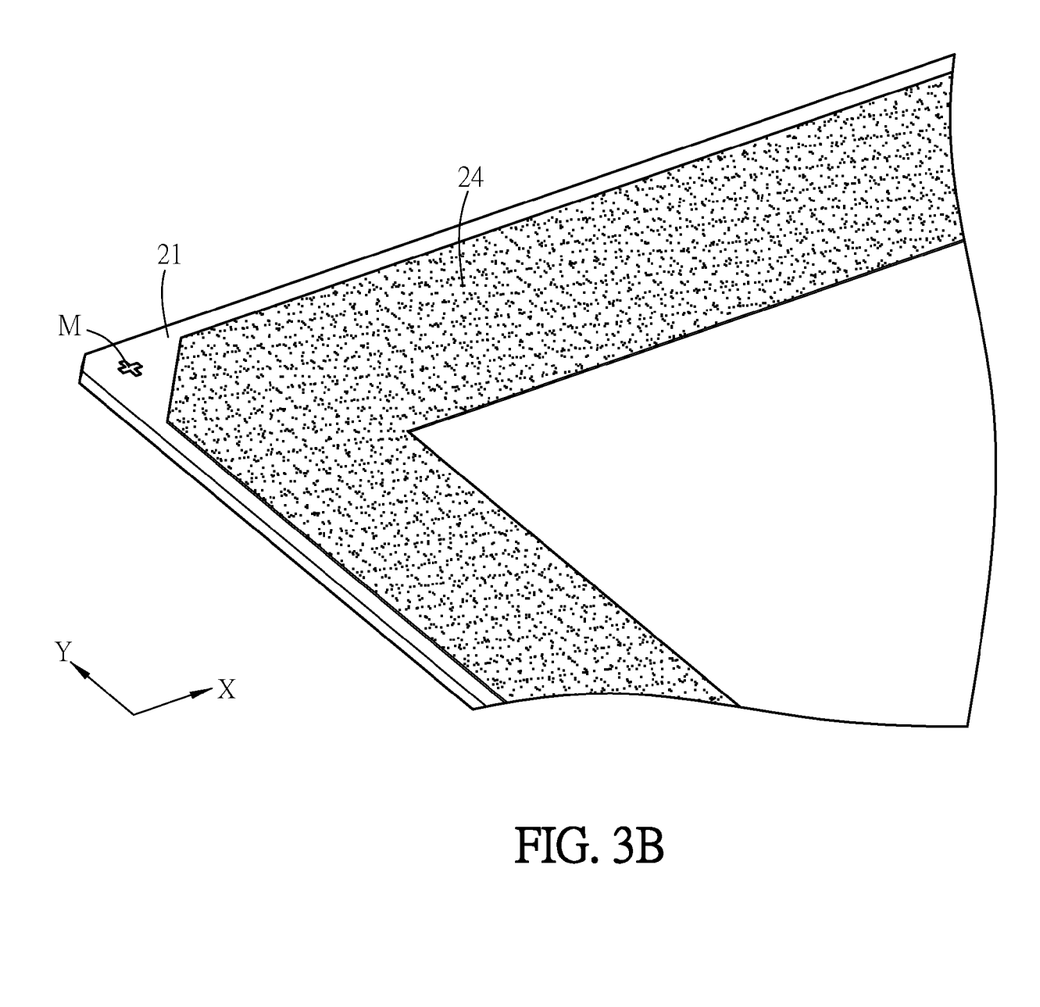
FIG. 3B is a schematic diagram showing the touch panel and the first adhesive assembly in the touch display device of FIG. 3A.

FIG. 3A is a schematic diagram showing a touch display device 2 according to another embodiment of the invention, and FIG. 3B is a schematic diagram showing the touch panel 21 and the first adhesive assembly 24 in the touch display device 2 of FIG. 3A. Herein, FIG. 3B is a bottom view of the touch panel 21 and the first adhesive assembly 24.

As shown in FIG. 3A, the touch display device 2 includes a touch-display module, a supporting element 23, a first adhesive assembly 24 and a second adhesive assembly 25. In addition, the touch display device 2 further includes a back plate 26, a backlight module 27 and a light-shielding element 28.

The touch display panel has a touch panel 21 and a display panel 22, which are disposed opposite to each other. The display panel 22 includes a first substrate 221, a second substrate 222 and two optical films 223 and 224. The first substrate 221 is disposed opposite to the second substrate 222. In this embodiment, the first substrate 221 is a color filter substrate, while the second substrate 222 is a thin-film-transistor (TFT) substrate. The optical film 223 is an upper polarizer, and the optical film 224 is a lower polarizer. The optical film 223 is disposed on the upper surface of the first substrate 221, and the optical film 224 is disposed on the lower surface of the second substrate 222. In addition, the display panel 22 further includes a liquid crystal layer (not shown), which is disposed between the first substrate 221 and the second substrate 222. Moreover, the touch display device 2 may further include a functional film ASF, which is disposed between the touch panel 21 and the optical films 223. Herein, the functional film ASF can be an anti-scattering film for providing a protection function. Since the functional film ASF is configured between the touch panel 21 and the display panel 22, it can protect the user or other components of the touch display device 2 from the ejected broken glass pieces.

The supporting element 23 supports the touch panel 21 and connects to the first adhesive assembly 24. The first adhesive assembly 24 is disposed at the periphery of the touch panel 21. In this embodiment, the first adhesive assembly 24 includes, for example, two coaxial squares disposed around the periphery of the lower surface of the touch panel 21. Herein, the first adhesive assembly 24 is, for example, a masking tape for blocking the light emitted from the backlight module 27 so as to prevent the light from emitting through the gap between the supporting element 23 and the display panel 22.

The second adhesive assembly 25 is located between the touch panel 21 and the display panel 22, and is disposed corresponding to the first adhesive assembly 24. Herein, the second adhesive assembly 25 is, for example, a frame glue (e.g. ABT), which is adhered between the touch panel 21 and the display panel 22, and is disposed corresponding to the first adhesive assembly 24.

The backlight module 27 is disposed corresponding to the display panel 22 for emitting light into the display panel 22, so that the display panel 22 can display the image normally. The backlight module 27 includes a reflective plate, a light guide plate and a plurality of optical films. The structure and function of the backlight module 27 is fully understood by those skilled persons, so the detailed description thereof will be omitted.

The back plate 26 accommodates the touch panel 21, the display panel 22, the supporting element 23 and the backlight module 27. The light-shielding element 28 is a light-shielding tape (e.g. a bezel tape) disposed on the back plate 26. In more detailed, the light-shielding element 28 is attached from the bottom surface to the top surface of the back plate 26 and the top surface edge of the touch panel 21 and across the side surface of the back plate 26. This configuration can strengthen the fixing intensity of the touch panel 21, the display panel 22, the supporting element 23 and the backlight module 27, and shield the emitted light so as to prevent the light leakage through the edge of the touch panel.

In addition, the first adhesive assembly 24 of the embodiment is coaxial square tapes. In order to facilitate the operation of an automatic equipment, it is desired to align the automatic equipment in advance so as to rapidly attach the first adhesive assembly 24 on the touch panel 21. As shown in FIG. 3B, an alignment mark M (e.g. a cross mark) is configured at a corner of the touch panel 21. This configuration and design is suitable for the large amount production of the touch display device 2.

To sum up, in the touch display device of the invention, the first adhesive assembly is disposed between the touch panel and the display panel, and the second adhesive assembly is disposed between the touch panel and the display panel and is adhered to the supporting element. In addition, a gap is configured between the first and second adhesive elements of the first adhesive assembly, and the third and fourth adhesive elements of the second adhesive assembly have an overlapped area corresponding to the gap. Compared with the conventional art, since the third and fourth adhesive elements are overlapped, the edge light leakage issue can be eliminated. Moreover, the first adhesive assembly is not configured on the overlapped area of the second adhesive assembly, so that the bonding area of the first adhesive assembly is a planar surface, thereby preventing the broken issue of the touch panel during operation. As a result, the touch display device of the present invention can improve the edge light leakage and easily broken issues.

In another embodiment, the touch display device includes a touch-display module, a supporting element, a first adhesive assembly and a second adhesive assembly. The touch-display module includes a touch panel and a display panel.

The supporting element supports the touch panel. The first adhesive assembly is disposed at the periphery of the touch panel. The second adhesive assembly is located between the touch panel and the display panel, and disposed corresponding to the first adhesive assembly. The configuration of the first adhesive assembly can block the light emitted from the backlight module so as to prevent the light from emitting through the gap between the supporting element and the display panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A touch display device, comprising:
   a touch-display module comprising a touch panel and a display panel;
   a supporting element supporting the touch panel and the display panel;
   a first adhesive assembly disposed between the touch panel and the display panel, and comprising a first adhesive element and a second adhesive element, wherein the first adhesive element and the second adhesive element are located adjacent to each other and have a gap therebetween; and
   a second adhesive assembly disposed between the touch panel and the display panel and adhered to the supporting element, wherein the second adhesive assembly comprises a third adhesive element and a fourth adhesive element, the third adhesive element and the fourth adhesive element having an overlapped area corresponding to the gap, and the gap having a first width along a first direction, the overlapped area having a second width along the first direction, and the first width being greater than or equal to the second width.

2. The touch display device of claim 1, wherein the first adhesive element is disposed corresponding to the third adhesive element, and the second adhesive element is disposed corresponding to the fourth adhesive element.

3. The touch display device of claim 1, wherein the first width is between 0.2 mm and 25 mm.

4. The touch display device of claim 1, wherein the second width is between 0.1 mm and 20 mm.

5. The touch display device of claim 1, wherein the first adhesive element, the second adhesive element, the third adhesive element and the fourth adhesive element have an L-shape, a strip shape or other shapes.

6. The touch display device of claim 1, further comprising:

a back plate for accommodating the touch-display module and the supporting element.

7. A touch display device, comprising:
a touch-display module comprising a touch panel and a display panel;
a supporting element supporting the touch panel and the display panel;
a first adhesive assembly disposed between the touch panel and the display panel, and comprising a first adhesive element and a second adhesive element, wherein the first adhesive element and the second adhesive element are located adjacent to each other and have a gap therebetween;
a second adhesive assembly disposed between the touch panel and the display panel and adhered to the supporting element, wherein the second adhesive assembly comprises a third adhesive element and a fourth adhesive element; and
a back plate for accommodating the touch-display module and the supporting element, wherein the back plate has a protrusion away from the supporting element, the protrusion has a first surface and a second surface opposite to the first surface, and the fourth adhesive element extends from the supporting element to the first surface and the second surface.

8. A touch display device, comprising:
a touch-display module comprising a touch panel and a display panel;
a supporting element supporting the touch panel and the display panel;
a first adhesive assembly disposed between the touch panel and the display panel, and comprising a first adhesive element and a second adhesive element, wherein the first adhesive element and the second adhesive element are located adjacent to each other and have a gap therebetween; and
a second adhesive assembly disposed between the touch panel and the display panel and adhered to the supporting element, wherein the second adhesive assembly comprises a third adhesive element and a fourth adhesive element, the third adhesive element and the fourth adhesive element having an overlapped area corresponding to the gap, the first adhesive assembly further comprising a fifth adhesive element, the second adhesive assembly further comprising a seventh adhesive element, a gap between the second adhesive element and the fifth adhesive element having a third width along a second direction perpendicular to the first direction, an overlapped area of the fourth adhesive element and the seventh element having a fourth width along the second direction, and the third width being greater than or equal to the fourth width.

* * * * *